US008658004B2

(12) United States Patent
Weinstein et al.

(10) Patent No.: US 8,658,004 B2
(45) Date of Patent: Feb. 25, 2014

(54) VAPOR-BARRIER VACUUM ISOLATION SYSTEM

(75) Inventors: Leonard M. Weinstein, Newport News, VA (US); Karen M. Taminger, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 1167 days.

(21) Appl. No.: 12/470,689

(22) Filed: May 22, 2009

(65) Prior Publication Data

US 2010/0122901 A1 May 20, 2010

Related U.S. Application Data

(60) Provisional application No. 61/114,511, filed on Nov. 14, 2008.

(51) Int. Cl.
*C23C 14/00* (2006.01)

(52) U.S. Cl.
USPC .......... 204/192.34; 216/94; 118/723 CB; 118/723 EB; 118/73 FE; 118/723 FI; 372/104; 204/192.11; 204/298.04; 204/298.36

(58) Field of Classification Search
USPC ........... 204/192.34, 192.11, 298.04, 298.36; 417/179, 151, 64; 372/61, 103, 104; 250/423 R, 424
See application file for complete search history.

(56) References Cited

U.S. PATENT DOCUMENTS

| 3,446,422 | A | * | 5/1969 | Bailleul-Langlais Josette et al. ................ 417/48 |
| 3,617,928 | A | * | 11/1971 | Hausmann ............ 372/90 |
| 4,358,249 | A | | 11/1982 | Hanson |
| 4,479,365 | A | * | 10/1984 | Holmes ............ 62/238.6 |
| 6,367,264 | B1 | | 4/2002 | Tyree et al. |
| 2005/0020070 | A1 | | 1/2005 | Ichiki et al. |
| 2008/0116604 | A1 | | 5/2008 | Thomas |
| 2008/0215039 | A1 | | 9/2008 | Slatkine et al. |

OTHER PUBLICATIONS

"adjacent" Merriam-Webster.com. 2012. http://www.merriam-webster.com (Nov. 30, 2012).*

* cited by examiner

*Primary Examiner* — Keith Hendricks
*Assistant Examiner* — John Brayton
(74) *Attorney, Agent, or Firm* — Jennifer L. Riley; Linda B. Blackburn; Andrea Z. Warmbier

(57) ABSTRACT

A system includes a collimated beam source within a vacuum chamber, a condensable barrier gas, cooling material, a pump, and isolation chambers cooled by the cooling material to condense the barrier gas. Pressure levels of each isolation chamber are substantially greater than in the vacuum chamber. Coaxially-aligned orifices connect a working chamber, the isolation chambers, and the vacuum chamber. The pump evacuates uncondensed barrier gas. The barrier gas blocks entry of atmospheric vapor from the working chamber into the isolation chambers, and undergoes supersonic flow expansion upon entering each isolation chamber. A method includes connecting the isolation chambers to the vacuum chamber, directing vapor to a boundary with the working chamber, and supersonically expanding the vapor as it enters the isolation chambers via the orifices. The vapor condenses in each isolation chamber using the cooling material, and uncondensed vapor is pumped out of the isolation chambers via the pump.

28 Claims, 3 Drawing Sheets

US 8,658,004 B2

VAPOR-BARRIER VACUUM ISOLATION SYSTEM

CROSS-REFERENCE TO RELATED APPLICATIONS

This application claims priority to and the benefit of U.S. Provisional Application 61/114,511, filed on Nov. 14, 2008, which is hereby incorporated by reference in its entirety.

ORIGIN OF THE INVENTION

The invention described herein was made by employees of the United States Government and may be manufactured and used by or for the Government of the United States of America for governmental purposes without the payment of any royalties thereon or therefor.

TECHNICAL FIELD

The present invention relates generally to high power charged particle beams such as ion beams or electron beams, and in particular to the generation of the same in a vacuum chamber for use in a connected working chamber or other working environment having a significantly greater pressure than that of the vacuum chamber.

BACKGROUND OF THE INVENTION

Certain collimated beams such as charged ion beams and electron beams can be used for vaporizing, cutting, welding, and/or melting of metals, as well as for micro fabrication, sputtering, etching, and other useful industrial processes. Effective collimated beam generation typically requires a high vacuum of approximately $10^{-3}$ to approximately $10^{-7}$ torr, depending on the particular design of the beam generating device. That is, in order to produce or generate a collimated charged particle beam, electron and ion beam generators or sources often require moderate-to-high vacuum conditions, and thus require substantial evacuation of a chamber in which the beam generating device or source is located.

Once generated, the beam exits the vacuum chamber through a hole, aperture, or orifice before propagating through the connected work chamber to a surface of a work piece. The orifice required for passage of the beam may be as large as several millimeters in diameter, a substantial opening which can represent a formidable vacuum leak in the vacuum chamber used for generating the beam. The entire connected working chamber is therefore usually evacuated to the same pressure level as the vacuum chamber.

The need to pump or evacuate the entire working volume of a large ion beam or electron beam system to such a high vacuum as noted above can entail considerable time, complexity, and related expense, and can likewise result in limited throughput. Conventional practice involves the use of differential pumping of intermediate chambers, a practice that can permit use of a collimated beam in a working chamber having a moderately higher pressure than that of the vacuum chamber of the source. However, this approach still requires the use of high-capacity pumps to achieve even moderate working chamber pressure levels, and with relatively small orifice diameters. Moreover, if the working chamber pressure is sufficiently high, the pumping requirement can quickly render as impractical such a differential pumping approach. Beam propagation for significant distances at intermediate pressures can also result in scatter, defocusing, and/or beam attenuation, which can collectively limit both the effectiveness and the utility of the collimated beam.

SUMMARY OF THE INVENTION

Accordingly, a system and method as set forth herein provide a cost-effective way to enable use of higher working chamber or working environment pressures in conjunction with high power charged particle beam device while using a minimal amount of mechanical pumping. The system and method can accommodate the high vacuum and short propagation path constraints of typical charged particle beam generators that require an open aperture or orifice for the discharge of the beam. A high-vacuum beam generation chamber or vacuum chamber, e.g., the vacuum chamber or volume of an electron gun, can be directly connected to a working chamber through a series of coaxial holes, openings, or orifices, with the working chamber having a significantly higher pressure relative to that of the source or vacuum chamber. For example, the vacuum chamber can be evacuated to approximately $10^{-6}$ torr while the connected working chamber is at a pressure of approximately 1 torr, although other vacuum or pressure levels can also be used within the intended scope of the invention. The system and method thus allow a continuously operated high-power beam to be generated at a high vacuum and used in a modest pressure environment.

The system and method both utilize the principle of cryopumping and free-jet supersonic expansion from a high-pressure volume into a lower-pressure volume, in conjunction with a minimal amount of mechanical pumping, to thereby very rapidly remove any residual vapors and other molecules from a gaseous flowing barrier or flowing sheet of a suitable vapor barrier gas. The resulting system, referred to hereinafter as a vapor barrier isolation system or VBS, connects a charged particle beam source at a moderately high vacuum, e.g., approximately $10^{-6}$ torr for illustrative purposes, to a working volume or working chamber at a substantially higher pressure, e.g., approximately 1 torr, again for illustrative purposes, via a series of coaxially-aligned orifices, with the working chamber held at the substantially higher pressure without the required use of high-capacity mechanical pumps.

The VBS includes one or more intermediate pressure dropping chambers, hereinafter referred to as isolation chambers, to progressively drop the pressure between the level of the working chamber and the level of the vacuum chamber using supersonic flow expansion driven in part by a pressure differential between the interconnected isolation chambers. The VBS can be adapted for removing most of the flow mass entering each isolation chamber before it enters a succeeding isolation chamber. To do so, a flowing layer or sheet of an easily condensable barrier vapor or gas, such as carbon dioxide ($CO_2$) gas, water vapor, etc., can be directed via a flow channel across an orifice of a first isolation chamber, and drawn or ingested therefrom into the first isolation chamber via the orifice, wherein the barrier gas rapidly expands as supersonic free flow upon entering each successive isolation chamber.

The ingested and supersonically-expanded barrier gas then decelerates to a subsonic flow through a normal shock, where it is then cryopumped or condensed onto integral or remotely-located cold traps, such as liquid-nitrogen filled copper coils, and retained in the form of frost. The remaining uncondensed barrier gas can then pass into a succeeding series of isolation chambers, if the VBS is so constructed, where the expansion and condensing processes are repeated. A small turbo-molecular pump can be used after the final stage of expansion and condensing to remove any remaining or uncondensed residual barrier gas and any other gases, and to further reduce the pressure. Any number of additional isolation chambers may be employed in this manner depending upon the beam characteristics and the required pressure differential between the beam source and the working chamber.

In particular, a vapor barrier vacuum isolation system or VBS includes a collimated charged particle beam source, e.g., an electron gun, ion gun, or other suitable collimated charged particle beam source, positioned within a vacuum chamber that is evacuated to a first pressure level. The VBS also includes a supply of condensable barrier gas such as carbon dioxide, water vapor, etc., and a supply of cooling material such as liquid nitrogen, Freon, refrigerant, etc. First and second isolation chambers can be placed in fluid communication with the condensable barrier gas, such that the isolation chambers are cooled by the cooling material to condense the barrier gas as it expands within the isolation chambers. A respective pressure level of each of the isolation chambers is substantially greater than the first pressure level in the vacuum chamber, with the pressure progressively decreasing in greater proximity to the vacuum chamber.

A series of coaxially-aligned orifices connects the isolation chambers, wherein each orifice is also coaxially-aligned with an axis of the beam. A small pump, such as a turbo-molecular pump or other suitable device, can be used to evacuate any uncondensed barrier gas and residual vapors after the barrier gas has passed through all of the provided isolation chambers. As noted above, the VBS is configured to allow the barrier gas to move as a flowing sheet across or past the first orifice in the series of coaxially-aligned orifices to thereby substantially block or prevent an inlet of atmospheric gases from the higher pressure working chamber or environment into the first isolation chamber, and to allow any ingested amounts of the barrier gas to undergo a supersonic free flow expansion upon entering the isolation chambers.

A method for using a collimated charged particle beam within a working chamber having a substantially higher working pressure than that of the vacuum chamber in which the beam is generated includes connecting a plurality of isolation chambers to the vacuum chamber containing the beam source, wherein the isolation chambers collectively include a series of coaxially-aligned orifices that are also coaxially-aligned with an axis of the collimated beam. The method includes directing a condensable barrier gas as a flowing sheet across a first orifice of the series of coaxially-aligned orifices to prevent an inlet of atmospheric gases into a first isolation chamber, cryopumping at or within each isolation chamber to condense the barrier gas, allowing a portion of the barrier gas to be drawn or ingested into the first isolation chamber. The first orifice is positioned at a boundary with the working chamber. The condensable barrier gas supersonically expands as it enters each succeeding isolation chamber, while as noted above, also preventing atmospheric gases or vapors in the working chamber from entering the isolation chambers. The barrier gas in each of the isolation chambers is condensed using cooling material, such as liquid nitrogen or other material circulated through one or more copper coils. Any uncondensed residual amounts of barrier gas, and any remaining molecular impurities, are then removed from the isolation chambers via a small mechanical pump.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
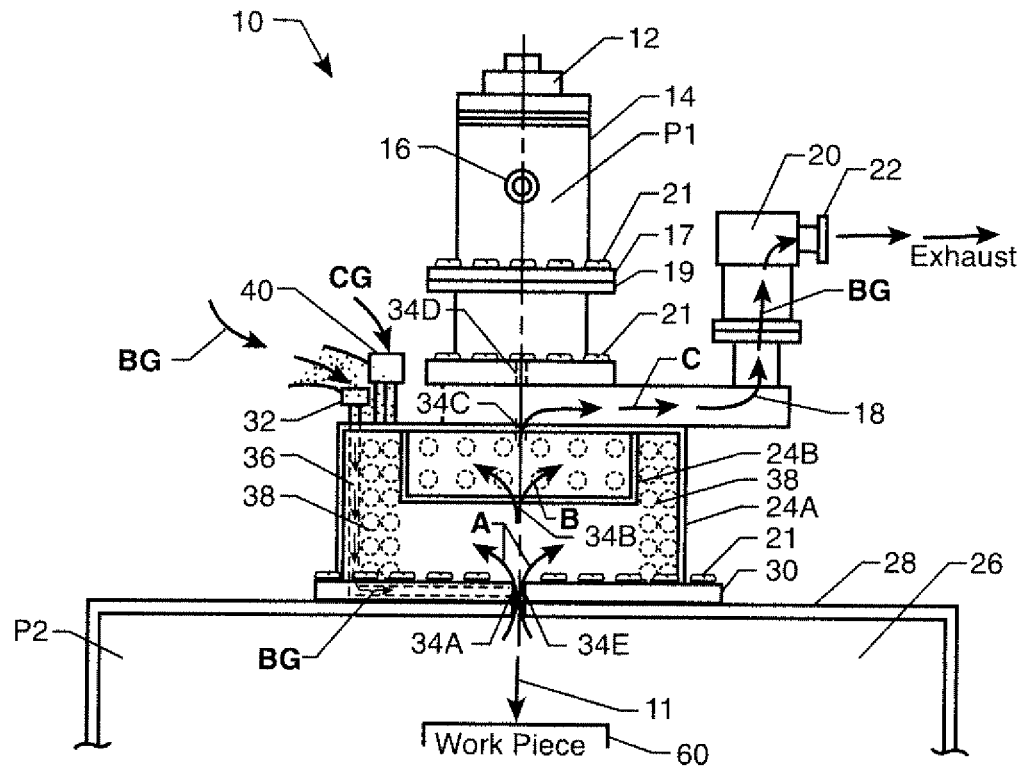
FIG. 1 is a schematic partial cross-sectional illustration of a vapor barrier isolation system or VBS in accordance with the invention.

Referring to the drawings, wherein like reference numbers represent like components throughout the several figures, and beginning with FIG. 1, a multi-stage vapor barrier vacuum isolation system or VBS 10 is operable for generating and applying a highly collimated beam 11, such as an electron beam or an ion beam, for use in a low pressure environment. Exemplary applications include processes relating to electron beam freeform fabrication (EBF$^3$) for near-net-shape manufacturing of aerospace or other alloy parts and/or components, as well as vaporizing, welding, cutting, and/or localized melting of metals.

For example, in the years ahead manned and unmanned missions to Mars are expected to become more frequent. The Martian atmosphere, which is predominantly carbon dioxide or $CO_2$, has an average ambient pressure of approximately 7.5 millibars or 5.6 torr. Depending on the ability to adequately focus and steer an electron beam at such a pressure level in a $CO_2$-rich environment such as the Martian atmosphere, it may be possible to fabricate parts using the EBF$^3$ process in a working chamber at such an ambient pressure, or perhaps obviate the need for a working chamber altogether. Such an atmosphere is exemplary, and those of ordinary skill in the art will appreciate that the VBS 10 as described herein can be used within other modest pressure environments without departing from the intended scope of the invention.

The VBS 10 includes a charged particle beam generation device or source 12 providing a source of ions or electrons, such as an ion or electron gun or generator, which is positioned within a beam generation chamber or source chamber 14. The source chamber 14 is evacuated and held to a very low pressure, i.e., a high vacuum, which is labeled P1 in FIG. 1, in order to minimize arcing. Pressure level P1 can vary depending on the design of the source 12, generally ranging from approximately $10^{-3}$ torr to $10^{-7}$ torr. While the actual vacuum level of the source chamber 14 can vary depending on the design of the VBS 10, for exemplary purposes a vacuum level (P1) of approximately $10^{-6}$ torr will be used hereinafter for the source chamber 14. The source chamber 14 can include a monitoring port 16 such as a pressure tap for a transducer, sensor, or other suitable monitoring device for continuously monitoring the pressure level P1 of source chamber 14.

The VBS 10 also includes a manifold 18 which serves as a fluid conduit between the source chamber 14 and a small turbo-molecular pump 20, hereinafter referred to simply as the pump 20. Specific operation of the pump 20 is described in greater detail below, but generally speaking the pump 20 is operable for drawing, extracting, or evacuating any trace uncondensed and other residual vapor or barrier gas from the VBS 10 via the manifold 18, and for discharging this vapor or gas to atmosphere or a storage vessel via an exhaust port 22 as shown in FIG. 1. To facilitate a leak-free connection between the source chamber 14 and the manifold 18, the source chamber 14 can include a flanged portion 17 which can be securely bolted or otherwise fastened to a mating flanged portion 19 of the manifold 18, such as by using a number of bolts 21 or other suitable fasteners.

The VBS 10 can further include a series or set of isolation chambers 24A, 24B and a working chamber 26. In the exemplary embodiment of FIG. 1, two isolation chambers 24A and 24B are used, although any number of additional isolation chambers can be used without departing from the intended scope of the invention. Additional isolation chambers can help affect a greater differential pressure between the source chamber 14 and the working chamber 26. For example, a pair of isolation chambers 24A, 24B as shown can be sufficient for connecting a high vacuum level of approximately $10^{-6}$ torr to a working pressure of approximately 1 torr in the working chamber 26, while additional isolation chambers could be used to affect a larger differential.

Regardless of the number of isolation chambers used in the construct of a given VBS 10, a first isolation chamber 24A can be mounted to a surface 28 of the working chamber 26, such as by bolting via bolts 21 or other suitable fasteners to a flanged portion 30 of the first isolation chamber 24A to the working chamber 26 at or along the surface 28 as shown. In an exemplary embodiment, the second isolation chamber 24B can be nested, set inside of, or otherwise substantially embedded within the larger first isolation chamber 24A as shown, an arrangement which shortens the beam length of the collimated beam 11, i.e., the distance between the source 12 and a surface of a work piece 60. A shorter beam length in turn reduces the interaction of the beam 11 with the atmosphere, thus optimizing performance of the beam 11.

Still referring to FIG. 1, the VBS 10 has an inlet port 32 for admitting a supply of a condensable barrier vapor or gas (arrows BG) as described below. The inlet port 32 is in fluid communication with a first orifice 34A via an internal fluid channel or barrier gas passage 36. A series of additional openings, holes, apertures, or orifices 34B, 34C, 34D are coaxially aligned with the first orifice 34A along an axis of the beam 11, with the orifice 34A being an orifice of the working chamber 26 and the first isolation chamber 24A, the orifice 34B being an orifice between the first isolation chamber 24A and the second isolation chamber 24B, and the orifice 34C being an orifice shared by the isolations chamber 24B and the manifold 18. The orifice 34D connects the source chamber 14 and the manifold 18, with the coaxially-aligned orifices 34A-D ultimately allowing the beam 11 to pass from the source 12 to the work piece 60. Thus, the barrier gas is admitted to the inlet port 32 and passes through the barrier gas passage 36 and across the first orifice 34A.

Figure 4:
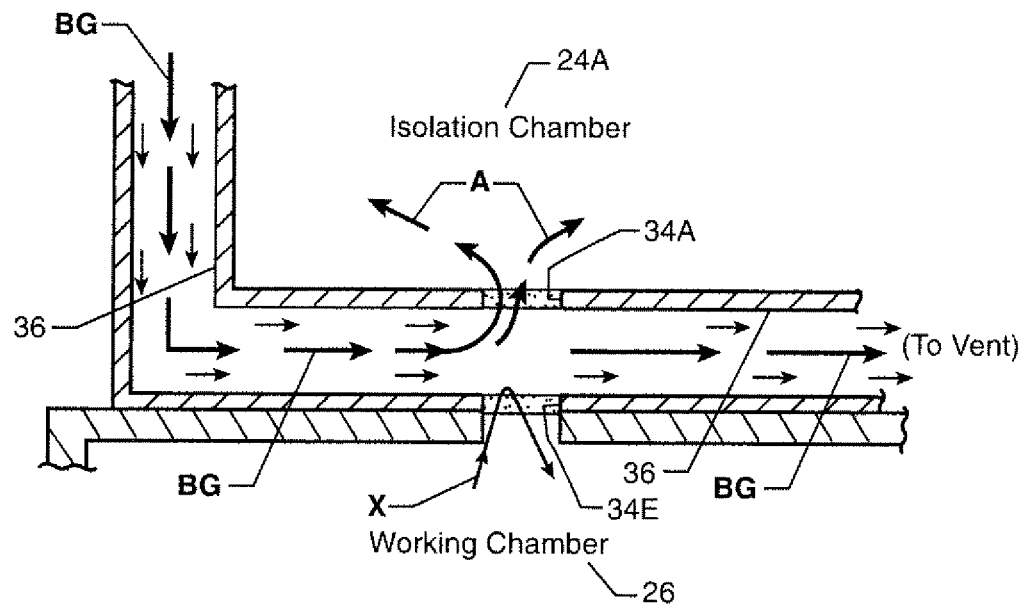
FIG. 4 is a partial cross-sectional illustration of a flow channel and orifice of the VBS of FIG. 1.

Referring briefly to FIG. 4, the barrier gas admitted to the inlet port 32 of FIG. 1 ultimately passes across the orifice 34A as a flowing layer or sheet of an easily condensable vapor, i.e., a gaseous material with a relatively high freezing point, such as but not limited to $CO_2$, steam, or any other nontoxic, environmentally benign, and relatively inexpensive gas having a condensation temperature that can be easily reached. Other gases can also be used, such as a host of organic materials, solvents, alcohol, ammonia, etc., when toxicity is less of a concern, or where venting is fully contained. The vapor pressure of the barrier gas can be set so that its static pressure is slightly above the working pressure (P2) in the working chamber 26. Much of the barrier gas is therefore drawn or ingested into the first isolation chamber 24A due to the pressure differential generated within that chamber, whereafter supersonic free flow expansion occurs, as indicated by the arrows A and described below.

As indicated by arrow x in FIG. 4, atmospheric gas or vapor in the working chamber 26 are prevented or blocked from entering the isolation chamber 24A through the orifice 34A by the flowing sheet or layer of barrier gas (arrows BG). That is, the barrier gas flows past the orifice 34A, through which some of the barrier gas is drawn or ingested into the isolation chamber 24A, with the remainder continuing along the barrier gas passage 36, thereafter recirculated or discharged to atmosphere as needed (not shown). The same sheet of barrier gas (arrows BG) has a sufficient density and flow rate to block or prevent any gases at the higher pressure (P2) of the working chamber 26 from being drawn into the orifice 34A by the pressure differential present between chambers 26 and 24A. Likewise, an exit orifice 34E between the barrier gas passage 36 and the working chamber 26 can be sized to limit the probability of such gases from entering the barrier gas chamber 36, e.g., by making the diameter of the barrier gas passage 36 approximately 2-3 times as large as that of the exit orifice 34E.

Referring again to FIG. 1, a principle of operation of the VBS 10 is that the condensable barrier gas ingested into the first isolation chamber 24A is rapidly cryopumped, frozen, and/or condensed onto highly cooled surfaces. In the embodiment shown in FIG. 1, a cold trap or Meissner coil can be provided by a bare coil 38 of copper tubing or other suitable material located within the first isolation chamber 24A, as well as in the second isolation chamber 24B and any additional isolation chambers used in the VBS 10.

A cooling port 40 can admit a suitable cooling material into the coil 38 from an external tank or supply (not shown). The coil 38, or multiple interconnected coils 38, can be cooled via a supply of an appropriate cooling material, e.g., a gaseous or liquid material having a temperature that is lower than the freezing point of the vapor introduced as the condensable gas or vapor at the inlet port 32. For example, when $CO_2$ is used as the condensable gas, liquid nitrogen or $LN_2$ can be used to condense the $CO_2$. When water vapor or steam is used as the condensable gas, refrigerant or Freon can be used in lieu of $LN_2$, without departing from the intended scope of the invention.

Entrained barrier gas hitting or contacting the outer surface of the coil 38 instantly condenses to form a solid frost, a process which maintains the low pressure in the first isolation chamber 24A by removing mass as fast as it enters the first isolation chamber 24A, i.e., the process of cryopumping. The frozen layer can build until it is thick enough to not be able to maintain a sufficiently low external temperature to maintain the desired vapor pressure because of the insulating effect of frost. Therefore, run time can be limited by the accumulation of sufficient frost on the coils 38 to impede efficient condensation of the incoming vapor, with the condensation rate slowing as the frost layer approaches approximately 2 mm in thickness. Control of vapor flow rates and coil geometry can therefore extend the useful run time of the VBS 10 in actual operation.

Figure 5:
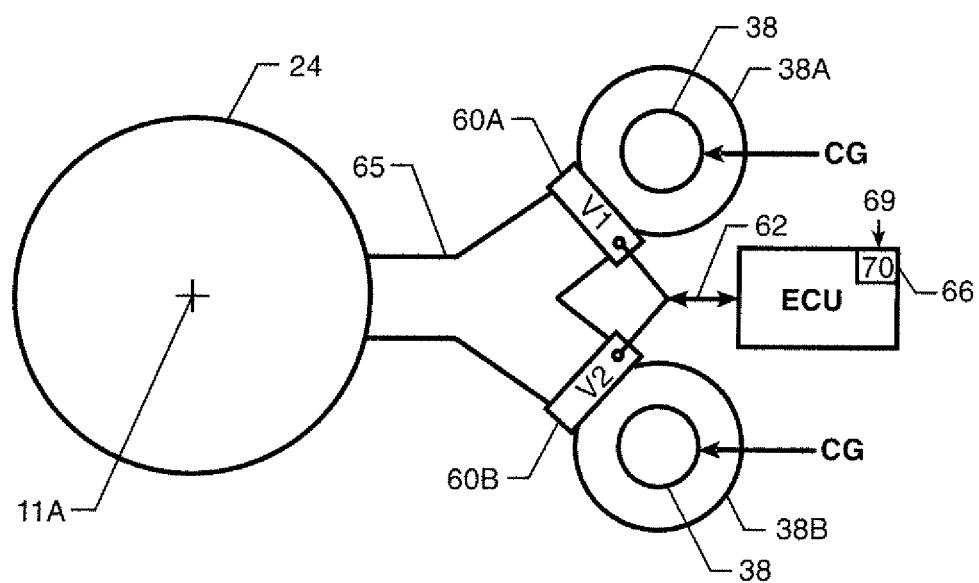
FIG. 5 is a schematic illustration of multiple cooling chambers usable with the VBS of FIG. 1.

Referring briefly to FIG. 5, an alternate embodiment for indefinitely extending the run times of the VBS 10 includes the use of coils 38 in a plurality of cooling chambers, such as a first and a second cooling chambers 38A, 38B as shown. The cooling chambers 38A, 38B are in fluid communication with an isolation chamber 24 via a manifold 65. The beam 11 (see FIG. 1) passes through the isolation chamber 24 along a beam axis 11A. The isolation chamber 24 can be either of the isolations chambers 24A, 24B shown in FIG. 1, as well as any additional such isolation chambers should additional stages be required.

Cooling material (arrows CG) is admitted into the coils 38 via the cooling port 40 of FIG. 1 as described above. Fluid communication between the isolation chamber 24 and the cooling chambers 38A, 38B can be selectively established using a valve 60A, 60B, respectively. Each valve 60A, 60B can be electrically connected to a controller or electronic control unit (ECU) 66 over a hard-wired or wireless link 67, with control logic 70 of the ECU 66 operating or actuating the valves 60A, 60B in response to set of sensor inputs 69, e.g., frost level readings, temperature readings, timer-based data, etc. In this manner, one cooling chamber 38A can be used while the other cooling chamber 38B is defrosted, and vice versa, thus allowing continuous operation of the VBS 10 of FIG. 1.

Referring again to FIG. 1, vapor pressure of $CO_2$ frozen on liquid nitrogen-cooled tubes of the coil 38 can be less than approximately $10^{-5}$ torr, but the minimum pressure achievable in an isolation chamber is limited by the mass flow dynamics to be higher than the wall vapor pressure. The presence of small amounts of less easily condensed trace gases entering the second isolation chamber 24B with the condensable vapor also limits the minimum achievable pressure. A small amount of mechanical pumping is therefore needed to remove this residual gas, and also helps to obtain a lower final pressure. The combination of careful internal aerodynamic design and the cryopumped barrier gas as described above resulting in a dramatic reduction in the amount of mechanical pumping required relative to conventional means, despite a relatively large diameter orifice connecting the beam source to the working chamber in the presence of high differential pressure.

Still referring to FIG. 1, an exemplary embodiment of the VBS 10 has at least two stages of expansion and cold trapping followed by a final pumping stage. A series of orifices 34A-34D of approximately 1 mm to approximately 4 mm can accommodate an electron or particle beam, i.e., beam 11, as it passes from the source 12 to the working chamber 26. The source chamber 14 can be evacuated to a high vacuum, e.g., approximately $10^{-6}$ torr in an exemplary embodiment. In general terms, the orifice diameters must be sufficiently large to avoid thermal damage from the beam 11 and also to minimize any adverse electromagnetic effects on the beam shape and direction. Conversely, the orifice diameters may not be so large as to adversely affect the sizing of the respective first and second isolation chambers 24A, 24B, or of the pump 20. Orifices should be constructed of sufficiently durable material, and should be designed for easy replacement of worn or damaged in service.

In an exemplary embodiment, the first isolation chamber 24A can provide approximately 30 mm of spacing for supersonic expansion (arrows A) and turning, i.e., the flow path length, to the next orifice, based on a 2 mm example. It should be observed that the region where the coils 38 are located, although shown completely contained within each isolation stage of the first and second isolation chambers 24A, 24B can be separated and connected through a flow channel, as long as the connecting cross section is large enough to allow the required flow rates. The result of the selected geometry of the first isolation chamber 24A and the use of the coil 38 is to remove approximately 99.8% or more of the input $CO_2$ vapor by freezing it to the cryogenically-cooled tube wall, as long as the solid build up is less than approximately 2 mm as noted above.

At least one cooling coil is contained within each of the first and second isolation chambers, with each cooling coil adapted for transferring the cooling material through the first and second isolation chambers to thereby condense the barrier gas substantially as fast as such barrier gas enters each chamber, thereby maintaining each chamber pressure. The cooling coil capacity of the first isolation chamber 24A is considerably larger than that of the second isolation chamber 24B by design, since most of the entrained vapor is removed in the first stage of expansion and condensing. With a working chamber pressure of approximately 5 torr, for example, the pressure in the first isolation chamber 24A could drop to approximately $10^{-2}$ torr, and to approximately $10^{-4}$ torr in the second isolation chamber 24B. The pump 20 could then drop the pressure in the source chamber 14 to about $10^{-6}$ torr or lower, with a total beam path length through the VBS 10 of approximately 75 mm or less.

Figure 2:
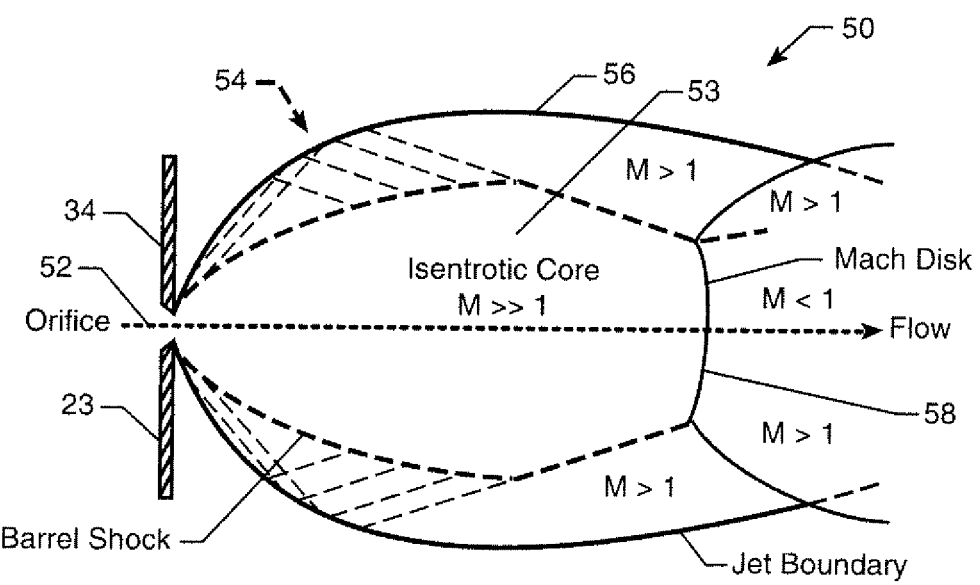
FIG. 2 is a graphical illustration describing supersonic free flow expansion.

Referring to FIG. 2, as will be understood by those of ordinary skill in the aerospace arts, a supersonic free expansion flow pattern 50 describes a supersonic free-expansion flow into a low-pressure chamber, i.e., a pattern that occurs as gas or vapor is admitted via an orifice 34 in a wall 23, e.g., a wall or other structural portion of the first or second isolation chamber 24A, 24B of FIG. 1. The flow path of the condensable gas or vapor is represented by arrow 52. In the isentropic core 53, the gas or vapor expands rapidly at speeds much greater than Mach 1 (i.e., M>>1). Speeds are reduced in the region 55 between the isentropic core 53 and the jet boundary 56, although speeds in this region, as well as the barrel shock region 54, remain supersonic. The boundary at which speeds again drop below supersonic speeds defines the Mach disk 58.

Once suitable beam aperture (orifice) sizes have been identified for the VBS 10 of FIG. 1 based on the ion or electron beam characteristics and vacuum requirements, the required isolation chamber lengths can be determined. The pressure ratio between the external flow and the isolation chamber is selected to be sufficiently high so that the entering vapor expands into a supersonic flow expansion, as shown in FIG. 2. This expansion terminates in a normal shock within the isolation chamber 24A, 24B and becomes subsonic downstream of the shock. Studies of these types of expansions have determined that a simple relationship exists between pressure, the ratio $p_0/p_1$, which is the ratio of the external total pressure $p_0$ to the effective chamber work pressure $p_1$ just downstream of the normal shock (Mach disk 58), and a downstream distance X from the orifice of diameter D to the Mach disk 58:

$$X/D = 0.67(p_0/p_1)^{1/2}$$

The above equation determines how many multiples of the hole or orifice diameter (X/D) is required for the supersonic flow to expand until it goes through a normal shock and again becomes subsonic. For example, for an exemplary pressure ratio of 400, X/D is approximately 13. However, the flow that goes through the shock also has to turn and flow to the sides during operation of the VBS 10 of FIG. 1 in order to be removed from the gas present in the first or second isolation chamber 24A, 24B, respectively. Estimates indicate that a total X/D of approximately 15 should allow this flow to escape to the sides.

Restated, this means that if the first isolation chamber 24A were about 15 orifice-diameters long, it would allow an overall operating pressure ratio of 400 to be obtained. Typical exit hole or orifice diameters for electron or ion sources range from approximately 1 mm to approximately 4 mm, so the first isolation chamber 24A can be quite compact, e.g., approximately 15 mm to approximately 60 mm. Note that more than one stage of supersonic expansion may be required depending upon the total pressure differential between the working chamber 26 and the source chamber 14 of FIG. 1. For example, for a total pressure ratio of 10,000, a single isolation chamber such as 24A would need to be at least 67 hole or orifice diameters in length. However, two isolation chambers connected in series as shown in FIG. 1 would only need to drop the pressure ratio by a factor of 100 each, and would have a combined length of less than 14 hole or orifice diameters, plus a minimal additional length allowing for flow turning and chamber structural considerations.

Figure 3:
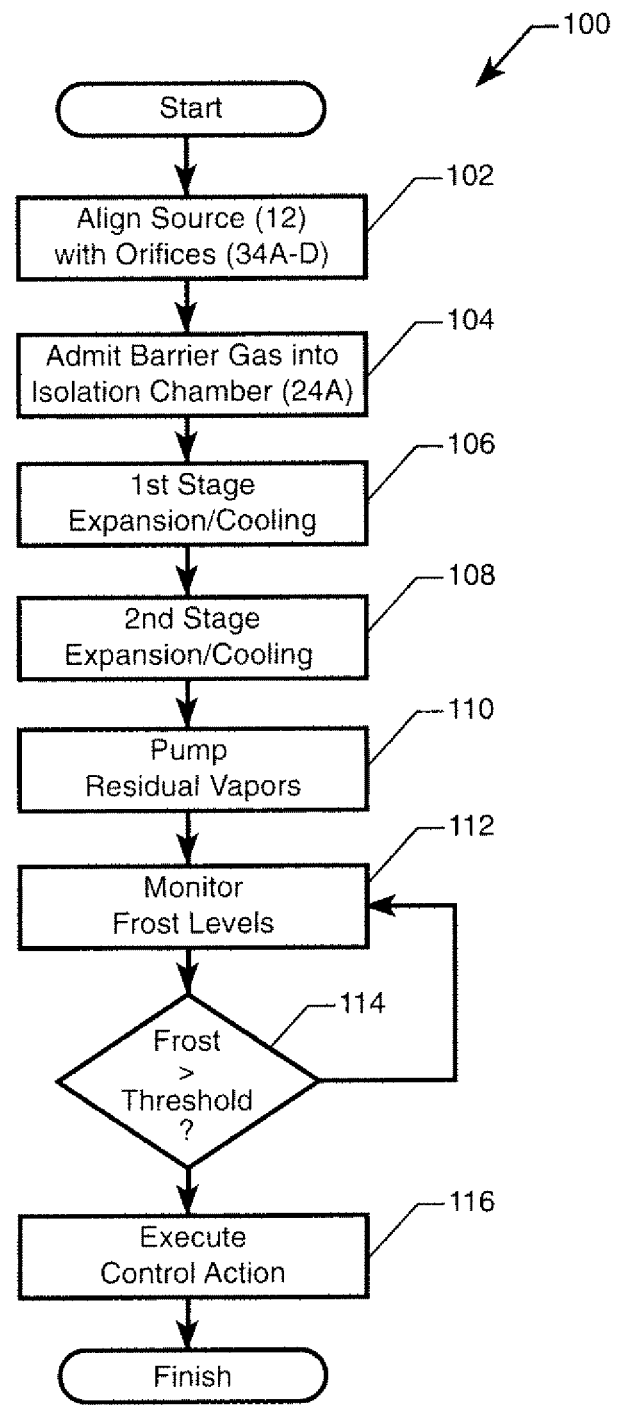
FIG. 3 is a flow chart describing a method for producing a high-power electron beam or ion beam at a high vacuum for use in a moderate pressure environment.

Referring to FIG. 3, a method 100 is provided for enabling higher allowable working chamber pressures in an electron beam or ion beam system, such as the VBS 10 of FIG. 1. Therefore, the method 100 as set forth below refers to the various elements and components of the VBS 10 shown in FIG. 1.

At step 102, a beam source 12 is coaxially-aligned with a series of orifices 34A-D of a plurality of isolation chambers, as well as the exit orifice 34E, such as the respective first and second isolation chambers 24A and 24B. That is, the axis of the beam 11 generated by the source 12 passes through the center points of each of the coaxially-aligned orifices 34A-E before entering the working chamber 26. Once so configured or provided, the method 100 proceeds to step 104.

At step 104, a suitable condensable vapor or barrier gas (arrow BG) is admitted into the inlet port 32 and barrier gas passage 36, where it passes as a flowing sheet or layer as noted above with reference to FIG. 4. Some of the barrier gas is drawn into the first isolation chamber 24A via the first orifice 34A. At the same time, cooling material such as liquid nitrogen ($LN_2$) is admitted into each of the isolation chambers 24A, 24B via the cooling port 40. As noted above, $LN_2$ can be directed into a coil 38 in each isolation chamber 24A, 24B. The method 100 then proceeds to step 106.

At step 106, the barrier gas drawn through the first orifice 34A is allowed to pass into the first isolation chamber 24A, and thereafter allowed to experience a first stage of freejet supersonic expansion, as represented by arrows A in FIG. 1. In this stage, the barrier gas admitted to the first isolation chamber 24A, such as $CO_2$ or another suitable gas, is cryogenically cooled, i.e., allowed to condense or freeze onto the coil 38 in the first isolation chamber 34A. The method 100 then proceeds to step 108.

At step 108, barrier gas that fails to condense or freeze onto the coil 38 in the first isolation chamber 24A is allowed to pass from the first isolation chamber 24A to the second isolation chamber 24B via the second orifice 34B. As the barrier gas enters the second isolation chamber 34B, it experiences a second stage of freejet supersonic expansion, as represented by arrows B in FIG. 1. In this stage, the barrier gas admitted to the second isolation chamber 24B is cryogenically cooled, i.e., allowed to condense or freeze onto the coil 38 in the second isolation chamber 24B. The method 100 then proceeds to step 110.

At step 110, residual barrier gas remaining uncondensed at step 108 is allowed to pass through the third orifice 34C and into the manifold 18. Alternately, if additional isolation chambers are provided, the residual barrier gas will be allowed to experience free jet expansion at each additional stage. Once the barrier gas enters the manifold 18, the pump 20 catches, compresses, and removes the molecules of any remaining barrier gas from the gaseous flow and vents this to atmosphere, or to a suitable holding vessel. The method then proceeds to step 112.

At step 112, the VBS 10 is monitored for a threshold level of frost or icing, particularly on the coils 38. Step 112 can be accomplished using any suitable detection, monitoring, or measurement means, including directly sensing or measuring a thickness of any accumulated frost on the coils 38, and/or indirectly by sensing a change in pressure within the respective first and second isolation chambers 24A and 24B. Once the level of frost is determined, the method 100 proceeds to step 114.

At step 114, the level of frost can be compared to a calibrated maximum threshold, such as approximately 2 mm in an exemplary embodiment. When at least a threshold level of icing is determined to be present, the method 100 proceeds to step 116, otherwise continuing in a loop with step 112 until the process with which the beam 11 is being used is finished.

At step 116, the method 100 can include executing a suitable control action. For example, step 116 can include temporarily suspending operation of the source 12 until a performance-acceptable level of icing or frost is present. As noted above, frost levels of approximately 2 mm can be correlated with reduced levels of beam performance in certain embodiments. Therefore, when frost thickness approaches approximately 2 mm, or any other suitable calibrated threshold, the operation of the VBS 10 can be temporarily halted until the coils 38 can be defrosted, with operation resuming thereafter. Alternatively, a valve 60 can be actuated to switch between connected coils 38A, 3B, as explained above with reference to FIG. 5, thus allowing one coil 38A or 38B to cool the barrier gas while the other coil 38A or 38B is defrosted.

One exemplary use or application of the VBS 10 described above is electron beam freeform fabrication or $EBF^3$, an emerging technology using a high-power electron beam in a vacuum to melt thin wire onto a substrate to fabricate complex 3D structures under computer numerical control. Multiple layers of material are deposited using successive passes of the beam to melt additional wire on the previously formed layers with nearly 100% material transfer efficiency. Close control of electron beam parameters such as focus, collimation, propagation path length, and interaction with gas molecules (scattering) is essential for optimal results using the $EBF^3$ process.

$EBF^3$ is at present the only practical process for near-net-shape, freeform fabrication using widely accepted aerospace alloys such as Ti-6Al-4V and Al 2219, among others. Reduction of the high vacuum level currently used in the $EBF^3$ process would enable smaller, lighter components (most significantly, the vacuum chamber itself) to be used and minimize some de-alloying and vaporization effects that have been observed. The electron beam then could be used to melt wire feedstock to fabricate a structure using multi-axis positioning mechanisms located within the working chamber.

While the best modes for carrying out the invention have been described in detail, those familiar with the art to which this invention relates will recognize various alternative designs and embodiments for practicing the invention within the scope of the appended claims.

What is claimed as new and desired to be secured by Letters Patent of the United States is:

1. A vapor barrier vacuum isolation system comprising:
   a collimated beam source positioned within a vacuum chamber that is evacuated to a first pressure level, the collimated beam source being adapted to generate one of an ion beam and an electron beam;
   a supply of a condensable barrier gas;
   a supply of cooling material;
   first and second isolation chambers each in fluid communication with the barrier gas and each including a respective cooling coil configured to receive the cooling material, wherein the temperature of the cooling material within each of the first cooling coil and the second cooling coil is below the freezing point of the condensable barrier gas, wherein the isolation chambers are cooled by the cooling material to thereby freeze the barrier gas as the barrier gas passes through the isolation chambers, and wherein a respective pressure level of each of the first and second isolation chambers is substantially greater than the first pressure level in the vacuum chamber;

a working chamber coupled with the first isolation chamber and having a pressure level higher than that of the vacuum chamber and each of the first and second isolation chambers;

a series of coaxially-aligned orifices connecting the working chamber, each of the isolation chambers, and the vacuum chamber, wherein each orifice of the series of coaxially-aligned orifices is also coaxially-aligned with an axis of the collimated beam; and a pump adapted to evacuate any uncondensed residual amounts of the barrier gas after the barrier gas has passed through each of the isolation chambers;

wherein the system is configured to allow the barrier gas to:

pass as a flowing sheet past a first orifice of the series of coaxially-aligned orifices to prevent atmospheric gasses from passing from the working chamber into the isolation chambers; and to undergo a supersonic flow expansion upon entering each of the isolation chambers.

2. The system of claim 1, further comprising: copper tubing defining the respective cooling coil contained within each of the first and the second isolation chambers, and adapted for transferring the cooling material through the first and the second isolation chambers to thereby freeze the barrier gas.

3. The system of claim 2, wherein the barrier gas is carbon dioxide vapor, and wherein the cooling material is liquid nitrogen.

4. The system of claim 1, wherein each orifice in the series of orifices has a diameter of approximately 1 mm to approximately 4 mm.

5. The system of claim 4, wherein the larger of the first and the second isolation chamber is approximately 15 mm to approximately 60 mm in length as measured along the axis of the beam.

6. The system of claim 1, further comprising a manifold providing a fluid connection between the pump and the smaller of the first and the second isolation chambers.

7. A vapor barrier vacuum isolation system comprising:
an electron gun positioned within a vacuum chamber having a first pressure level, the electron gun being adapted to generate a collimated electron beam;
a supply of condensable carbon dioxide ($CO_2$) vapor;
a supply of liquid nitrogen ($LN_2$);
a first and a second isolation chamber, each containing a respective cooling coil configured to receive the supply of $LN_2$ to thereby cool the respective chamber, each of the first and second isolation chambers being connected via a series of coaxially-aligned orifices that are also coaxially-aligned with an axis of the collimated electron beam, wherein the $CO_2$ vapor is admitted into the first isolation chamber and passes therethrough to the second isolation chamber via the series of orifices, and wherein the $CO_2$ vapor is cooled and freezes to the respective cooling coils within each of the first and the second isolation chambers using the $LN_2$; and a turbo-molecular pump adapted to evacuate any uncondensed residual amounts of the $CO_2$ vapor from the system after the $CO_2$ vapor passes through the series of coaxially-aligned orifices;

wherein the system is configured to allow the $CO_2$ vapor to:
pass as a flowing sheet past a first orifice of the series of coaxially-aligned orifices to act as a barrier gas preventing atmospheric gasses from passing from the working chamber into the isolation chambers; and
to undergo a supersonic flow expansion upon entering each of the isolation chambers.

8. The system of claim 7, wherein each orifice in the series of coaxially-aligned orifices has a diameter that is less than approximately 4 mm.

9. The system of claim 7, including a plurality of valves and a plurality of cooling chambers, wherein each cooling chamber is selectively connectable to one of the first and the second isolation chambers via a corresponding one of the valves to allow one of the cooling chambers to be cooled by the $LN_2$ while the other is defrosted.

10. The system of claim 7, wherein a length of the larger of the first and the second isolation chamber is approximately 15 mm to approximately 60 mm, as measured along the axis of the collimated electron beam.

11. The system of claim 7, wherein one of the first and the second isolation chamber is nested at least partially within the other.

12. The system of claim 11, wherein the first isolation chamber is mounted to a working chamber having a pressure greater than approximately 1 torr, and wherein one of the orifices of the series of coaxially-aligned orifices connects the working chamber to the first isolation chamber.

13. The system of claim 7, including a fluid channel contained at least partially within the first isolation chamber, wherein the fluid channel is in fluid communication with the supply of $CO_2$ vapor and with a first orifice of the series of coaxially-aligned orifices.

14. A method for using a collimated beam within a working chamber having a working pressure that is substantially greater than a pressure level of a vacuum chamber in which the collimated beam is generated, the method comprising:
connecting a plurality of isolation chambers to the vacuum chamber, wherein the isolation chambers collectively include a series of coaxially-aligned orifices that are also coaxially-aligned with an axis of the collimated beam;
directing a condensable vapor as a barrier gas past a first orifice of the series of coaxially aligned orifices, the first orifice being positioned at a boundary with the working chamber;
allowing a portion of the condensable vapor to be drawn into a first isolation chamber of the plurality of isolation chambers, and to supersonically expand as the portion of the condensable vapors subsequently enters each of the plurality of isolation chambers;
freezing the condensable vapor in each of the isolation chambers using a cooling coil disposed in each of the respective isolation chambers that is configured to receive the supply of cooling material having a temperature below the freezing point of the condensable vapor; and
pumping any uncondensed residual amounts of the condensable vapor out of the isolation chambers after the condensable vapor has passed through each of the isolation chambers;

wherein the condensable vapor acts as the barrier gas by substantially blocking atmospheric gasses in the working chamber from entering the isolation chambers via the first orifice.

15. The method of claim 14, wherein directing a condensable vapor past a first orifice includes directing a supply of one of carbon dioxide vapor and water vapor past the first orifice.

16. The method of claim 14, wherein the plurality of isolation chambers includes a first and a second isolation chamber, wherein connecting a plurality of isolation chambers to the vacuum chamber includes nesting the second isolation chamber at least partially within the first isolation chamber.

17. The system of claim 1, wherein the flow of the barrier gas past the first orifice is orthogonal to the axis of the collimated beam.

18. The system of claim 1, further comprising a barrier gas passage disposed between the working chamber and the first isolation chamber;
wherein the first orifice of the series of coaxially-aligned orifices is disposed between the barrier gas passage and the first isolation chamber; and
wherein the barrier gas is configured to pass as a flowing sheet past the first orifice through the barrier gas passage.

19. The system of claim 1,
wherein the first cooling coil and the second cooling coil respectively contained within each of the first and second isolation chambers, with each cooling coil adapted for transferring the cooling material through the first and second isolation chambers to thereby freeze the barrier gas substantially as fast as such barrier gas enters each chamber, thereby maintaining each chamber pressure.

20. The system of claim 7, further comprising a barrier gas passage adjacent to the first isolation chamber;
wherein the first orifice of the series of coaxially-aligned orifices is disposed between the barrier gas passage and the first isolation chamber; and
wherein the $CO_2$ vapor is configured to pass as a flowing sheet past the first orifice through the barrier gas passage.

21. A system comprising:
a vacuum chamber evacuated to a first pressure level;
a collimated beam source disposed within the vacuum chamber and configured to generate one of an ion beam and an electron beam;
a working chamber including a gas maintained at a working pressure greater than the first pressure level;
a first isolation chamber and a second isolation chamber, the first isolation chamber in fluid communication between the second isolation chamber and the working chamber, and the second isolation chamber in fluid communication between the vacuum chamber and the first isolation chamber;
a barrier gas passage coupled with a supply of a condensable barrier gas and in fluid communication between the first isolation chamber and the working chamber;
a manifold coupled with a vacuum pump and fluidly disposed between the second isolation chamber and the vacuum chamber, the vacuum pump configured to evacuate gas from the manifold;
a first orifice disposed between the working chamber and the barrier gas passage; a second orifice disposed between the barrier gas passage and the first isolation chamber; a third orifice disposed between the first isolation chamber and the second isolation chamber; a fourth orifice disposed between the second isolation chamber and the manifold; and a fifth orifice disposed between the manifold and the vacuum chamber, the first through fifth orifices being aligned such that the ion beam or electron beam may pass through each of the respective orifices and into the working chamber;
a first cooling coil disposed within the first isolation chamber, and a second cooling coil disposed within the second isolation chamber, wherein each of the first cooling coil and second cooling coil are respectively in fluid communication with a supply of a cooling material, and wherein the temperature of the cooling material within each of the first cooling coil and the second cooling coil is below the freezing point of the condensable barrier gas;
wherein the condensable barrier gas is configured to pass as a flowing sheet across the first orifice to prevent the gas in the working chamber from passing from the working chamber into the first isolation chamber;
wherein a portion of the condensable barrier gas is configured to be drawn through the second orifice into the first isolation chamber; and
wherein the portion of the condensable barrier gas that enters the first isolation chamber undergoes supersonic flow expansion upon entering the chamber.

22. The system of claim 21, wherein the first isolation chamber is cooled by the cooling material to thereby freeze the condensable barrier gas as the condensable barrier gas enters the first isolation chamber.

23. The system of claim 22, wherein a portion of the condensable barrier gas within the first isolation chamber is configured to be drawn through the third orifice into the second isolation chamber;
wherein the portion of the condensable barrier gas that enters the second isolation chamber undergoes supersonic flow expansion upon entering the chamber; and
wherein the second isolation chamber is cooled by the cooling material to thereby freeze the condensable barrier gas as the condensable barrier gas enters the second isolation chamber.

24. The system of claim 23, wherein a portion of the condensable barrier gas within the second isolation chamber is configured to be drawn through the fourth orifice into the manifold, where it is evacuated by the vacuum pump.

25. The system of claim 21, wherein the working pressure is more than 1,000,000 times greater than the first pressure level.

26. The system of claim 21, wherein the second isolation chamber is nested within the first isolation chamber.

27. The system of claim 21, wherein the working chamber is open to atmosphere, and where the working pressure is atmospheric pressure.

28. The system of claim 21, wherein the first orifice has a diameter of between 1 mm and 4 mm.

* * * * *